(12) United States Patent
Sakata et al.

(10) Patent No.: US 6,252,247 B1
(45) Date of Patent: Jun. 26, 2001

(54) THIN FILM TRANSISTOR, A METHOD FOR PRODUCING THE THIN FILM TRANSISTOR, AND A LIQUID CRYSTAL DISPLAY USING A TFT ARRAY SUBSTRATE

(75) Inventors: Kazuyuki Sakata; Kazunori Inoue; Toru Takeguchi, all of Tokyo; Nobuhiro Nakamura; Masaru Yamada, both of Kumamoto, all of (JP)

(73) Assignees: Mitsubishi Denki Kabushiki Kaisha, Tokyo; Advanced Display Inc., Kikuchi-gun, both of (JP)

( * ) Notice: Subject to any disclaimer, the term of this patent is extended or adjusted under 35 U.S.C. 154(b) by 0 days.

(21) Appl. No.: 09/168,091

(22) Filed: Oct. 8, 1998

(30) Foreign Application Priority Data

Mar. 31, 1998 (JP) .................................................. 10-086292

(51) Int. Cl.[7] .......................... H01L 27/02; H01L 23/48; H01L 21/20
(52) U.S. Cl. .............................. 257/57; 257/59; 257/383; 257/384; 257/408; 257/751; 257/766; 438/158; 438/460; 438/694
(58) Field of Search .................................. 438/158, 460, 438/694, 151; 257/765, 771, 384, 383, 403, 766, 408, 57, 59

(56) References Cited

U.S. PATENT DOCUMENTS

| | | | |
|---|---|---|---|
| 5,162,933 | * | 11/1992 | Kakuda et al. ........................ 359/59 |
| 5,202,274 | * | 4/1993 | Bae et al. ............................... 437/40 |
| 5,495,121 | * | 2/1996 | Yamazaki et al. .................... 257/384 |
| 5,514,909 | * | 5/1996 | Yamamoto et al. .................. 257/765 |
| 5,691,782 | * | 11/1997 | Nishikawa et al. .................... 349/47 |
| 5,950,077 | * | 9/1999 | Ohue et al. ........................... 438/149 |
| 5,970,326 | * | 10/1999 | Lawley et al. ........................ 438/158 |
| 6,087,730 | * | 7/2000 | McGarvey et al. .................. 257/766 |

FOREIGN PATENT DOCUMENTS 7-77706    3/1995  (JP) .

* cited by examiner

Primary Examiner—Michael Lebentritt
(74) Attorney, Agent, or Firm—Oblon, Spivak, McClelland, Maier & Neustadt, P.C.

(57) ABSTRACT

A thin film transistor (TFT) device including a first electrode including at least one of a gate, a source and a drain formed on a transparent insulating substrate, an insulating film layer covering both the first electrode and the transparent insulating substrate, and a transparent film electrode formed on the insulating film layer. The first electrode includes a first layer made of pure Al or Al alloy and a second layer, formed by an impurity selected from one of N, O, Si and C, added to the Al or Al alloy. The second layer of the first electrode is provided at an interconnection between the transparent film electrode and the first layer of the first electrode.

47 Claims, 4 Drawing Sheets

THIN FILM TRANSISTOR, A METHOD FOR PRODUCING THE THIN FILM TRANSISTOR, AND A LIQUID CRYSTAL DISPLAY USING A TFT ARRAY SUBSTRATE

BACKGROUND OF THE INVENTION

The present invention relates to a TFT (thin film transistor), a producing method therefor and a liquid crystal display using a TFT array substrate.

Generally, matrix type liquid crystal displays are so structured that a display material, such as a liquid crystal, is interposed between a TFT array substrate, on which the TFT formed of a semiconductor thin film is formed, and an opposite substrate, and a voltage is applied to the display material selectively for each pixel. On the opposite substrate, a counter electrode, color filters, black matrixes and others are formed. In the following, this structured-LCD (liquid crystal display) using the TFT array substrate is referred to as TFT-LCD.

In the TFT array substrate, at least the TFT comprising a gate electrode; a source electrode; a drain electrode; and a semiconductor thin film and a pixel electrode are arranged for each element in an array form on an insulating substrate made of glass and the like, and when necessary, an alignment film, a storage capacitance and others are provided. Between the pixels of each pair, a plurality of signal conductors, such as gate wiring and source wiring, are arranged in parallel to each other, to form a display area. Further, at the outside of the display area, an input terminal and a drive circuit for driving the TFT are arranged in association with each of the signal conductors.

To fabricate the LCD using this TFT array substrate, the TFT, a gate electrode and a source wiring that are simply called a gate, a source electrode and a source wiring that are simply called a source, and a drain electrode which is sometimes simply called a drain, and other common wiring are formed on a glass substrate into an array form to produce the active area, and also the input terminal, extra wiring, the drive circuit, are arranged around the active area. To allow their own functions to develop, a conductive thin film (hereinafter referred to as a conductive film) and an insulating thin film (hereinafter referred to as an insulating film) are then arranged, as necessary. Also, the counter electrode is formed on the opposite substrate, together with the color filters and the black matrixes.

The TFT array substrate and the counter substrate, after fabricated, are put into a state of being spaced from each other with a predetermined distance so that a liquid crystal material can be filled in a space between them and then are bonded together at their marginal portions. Thereafter, the liquid crystal material is filled in the space between the two substrates to thereby produce the LCD.

Various kinds of semiconductor devices are formed on the TFT array substrate and the opposite substrate for use in LCD by using technique of thin-film. In those semiconductor devices, there are formed the semiconductor film, the insulating film and the conductive film, and further a contact hole extending through an interlayer insulating film and the semiconductor film (hereinafter referred to as semiconductor film) is formed, such that an electrical connection between the layers is allowed.

As the TFT-LCD increases in size and high definition, pure aluminum (Al) or Al alloy material of low electrical resistance having Al as a major component is being desired to be used for the gate wiring and the source/drain wiring, in order to prevent a signal delay, from the points of its characteristics and process. However, when the second electrodes, made of indium tin oxide (ITO) and the like, forming transparent pixel electrodes are brought into contact with the first electrodes made of pure Al or Al alloy, the contact resistivity becomes so high as 1E10 to 1E12 $\Omega$ that good contact characteristics cannot be obtained.

Thus, it was substantially impossible to realize a TFT array substrate that enables the first electrodes, made of pure Al or Al alloy, and the second electrodes, formed of a transparent conductive film of ITO, to be brought into direct contact (connection) with each other through the contact hole opening in the insulating film.

For solving this problem and providing improved contact, the prior art proposed an approach that the first electrodes were formed into a two-layer structure in which chrome(Cr), titanium(Ti), molybdenum(Mo), copper(Cu), nickel(Ni), or the like is deposited on the pure Al or the Al alloy, as disclosed by, for example, Japanese Unexamined Patent Publication No. 253342/1992, Japanese Unexamined Patent Publication No. 305627/1992 and Japanese Unexamined Patent Publication No. 18058/1996.

As aforementioned, in the conventional producing method, the contact resistivity between the second electrodes made of ITO and the like and the first electrodes made of pure Al or Al alloy becomes so high as 1E10 to 1E12 $\Omega$ that good contact resistivity cannot be obtained. Also, in another conventional method in which the first electrodes are formed into a two-layer structure of different materials in order to obtain an improved contact, it is impossible to perform simultaneous etching by using the same chemical agent, thus requiring two etching processes using two different chemical agents, to cause an increase in process complexity. The object of the present invention is to provide a high-performance TFT which is so structured that a good contact resistivity can be obtained in contacting portions between the second electrodes and the first electrodes and which is formed into such a two-layer structure as to enable the first electrodes to be etched simultaneously by using the same chemical agent so that an Al wiring material of low resistance can be used to reduce manufacturing costs and increase productivity; a producing method therefor; and a liquid crystal display.

SUMMARY OF THE INVENTION

A method for producing a thin film transistor of the invention according to the present invention comprises the steps of:
(i) forming a first electrode, comprising at least one of a gate, a source and a drain, on a transparent insulating substrate by using either of pure Al and Al alloy;
(ii) adding an impurity comprising at least one of N, 0, Si and C to an upper layer of the first electrode, to form a second layer to which the impurity is added and a first layer to which the impurity is not added;
(iii) depositing an insulating film on the first electrode and the substrate, said insulating film covering the first electrode and the substrate;
(iv) subjecting the insulating film to a patterning to form a contact hole; and
(v) forming a second electrode comprising a transparent film electrode on the insulating film, to electrically connect the second electrode with the first electrode through the contact hole.

The thin film transistor of the invention according to the present invention comprises: a first electrode comprising a gate, a source and a drain formed on a transparent insulating substrate; an insulating film formed on the first electrode and the transparent insulating substrate, the insulating film covering the first electrode and transparent insulating substrate; and a second electrode formed on the insulating film, the first electrode comprising a first layer of a lower layer made of either of pure Al and Al alloy and a second layer formed by an impurity comprising at least one of N, O, Si and C being added to the either of the pure Al and the Al alloy, the second electrode comprising a transparent film electrode, to electrically connect the second electrode with the second layer of the first electrode.

In the thin film transistor of the invention according to the present invention, an impurity composition profile is in the form of being continuously distributed in an interfacial boundary between the first layer and the second layer.

In the thin film transistor of the invention according to the present invention, the first layer and the second layer are formed of layers able to be etched simultaneously.

In the thin film transistor of the invention according to claim 5, the transparent film electrode is made of any of indium oxide, tin oxide, indium tin oxide and zinc oxide.

A liquid crystal display of the invention according to the present invention comprises a TFT array substrate including at least a thin film transistor comprising a first electrode comprising a gate, a source and a drain formed on a transparent insulating substrate; an insulating film formed on the first electrode and the transparent insulating substrate, the insulating film covering the first electrode and said transparent insulating substrate; and a second electrode formed on the insulating film, the first electrode comprising a first layer of a lower layer made of either of pure Al and Al alloy and a second layer formed by an impurity comprising at least one of N, O, Si and C being added to the either of the pure Al and the Al alloy, the second electrode comprising a transparent film electrode, to electrically connect the second electrode with the second layer of the first electrode.

The second layer is formed by sputtering using $Ar+N_2$ mixed gas.

The second layer is formed by sputtering using either of an $Ar+N_2+CO_2$ mixed gas and an $Ar+N_2+CF_4$ mixed gas.

The second layer is formed by the process that after deposition of the first layer made of at least either of the pure Al and the Al alloy, $N_2$ ions are filled therein.

The second layer is formed on only a surface of a contacting portion by the filling of $N_2$ ions after the aforementioned process (iv).

The second layer is formed by the process that the first layer is formed and then is annealed in an atmosphere of nitride gas.

The second layer is formed on only the surface of the contacting portion by the annealing in an atmosphere of nitride gas after the aforementioned process (iv).

The second layer is formed by $N_2$ plasma treatment after the deposition of the first layer.

The second layer is formed on only the surface of the contacting portion by the $N_2$ plasma treatment after the aforementioned process (iv).

The addition of an impurity to the second layer is made by using any of gas including O as a substitute for N, gas including Si, and gas including C.

The second layer is formed by sputtering using $Ar+NH_3$ mixed gas.

The second layer is formed by the process that after the deposition of the first layer, the transparent insulating substrate on which the first layer is formed is immersed in $NH_4OH$ and then is annealed.

In the insulating film deposition process of the process (iii) of the present invention, the insulating film is formed of a silicon nitride film, and the second layer which is allowed to have Si and N as impurities by diffusion is formed on the surface of the first electrode made of either of the pure Al and the Al alloy.

The second layer is formed by allowing the silicon nitride film of the insulating film to grow by CVD method using the mixed gas of $SiH_4$, $H_2$, $NH_3$ and $N_2$, to allow Si and N to diffuse on the surface of the first layer.

The silicon nitride film of the insulating film is formed to have at least a two-layer structure, and the initial layer of silicon nitride film, in particular, is formed by CVD method using the mixed gas of $SiH_4$, $H_2$, $NH_3$ and $N_2+CF_4$.

In the insulating film deposition process of the process (iii) of the present invention, the insulating film is formed of $SiO_2$, and the second layer which is allowed to have Si and O as impurities by diffusion is formed on the surface of the first electrode made of either of the pure Al and the Al alloy.

In the process for forming the second electrode formed of the transparent electrode in the process (v) of the present invention, the second electrode comprises the first layer formed by sputtering using at least the Ar gas only and the second layer formed by sputtering using the mixed gas of $Ar+O_2$ and also the first layer of the second electrode and the second layer of the first electrode are electrically connected.

DETAILED DESCRIPTION

The embodiments of the present invention will be described in detail below with reference to the accompanying drawings.

Embodiment 1

FIGS. 1(a), 1(b), 2(a), 2(b) and 3 are sectional views illustrating in order the producing processes of a TFT portion and a terminal portion of a TFT array substrate according to the present invention. In FIGS. 1(a), 1(b), 2(a), 2(b) and 3, numeral 21 denotes the TFT portion; numeral 22 the terminal portion; numeral 1 a transparent insulating substrate, numeral 2 a first layer of the first electrode (the first electrode of the TFT portion is a gate electrode); numeral 3 a second layer of the first electrode; numeral 4 a gate insulating film; numeral 5 a semiconductor film of a-Si film; numeral 6 a semiconductor film of n+a-Si film; numeral 7 the first layer of the first electrode (the first electrode of the TFT portion is a source/drain electrode); numeral 8 a second layer of the first electrode; numeral 9 an interlayer insulating film; numeral 10 contact holes; and numeral 11 a second electrode (pixel electrode). The TFT portion 21 is located in the vicinity of an intersection between a gate wiring and a source wiring (neither of them being shown) intersecting at right angles on the TFT array substrate, to form a switching element for driving a liquid crystal. The terminal portion 22 is disposed at the outside of a display panel, with the gate wiring being extended, to enter a signal into the gate electrode from outside.

Figure 1A:
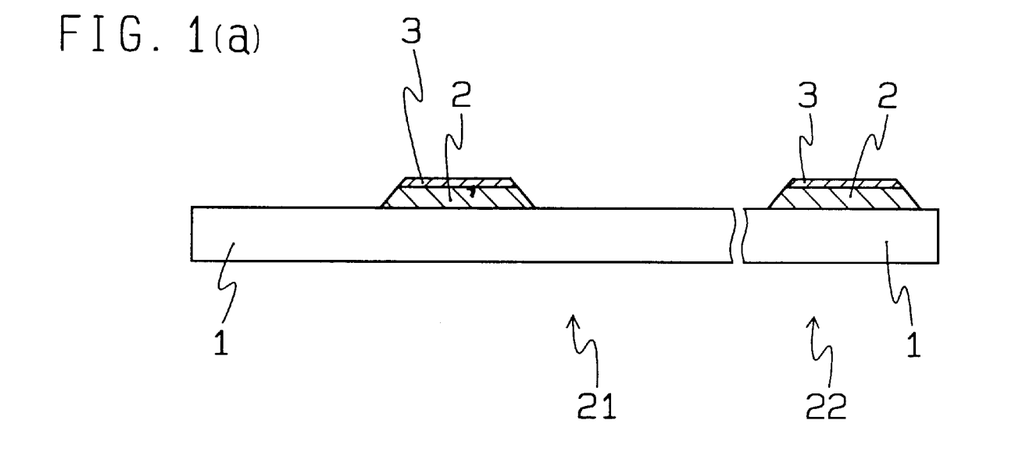
FIGS. 1(a) and 1(b) are each is a sectional view illustrating the structure of a TFT portion and a terminal portion according to EMBODIMENT 1 of the present invention.
Figure 1B:
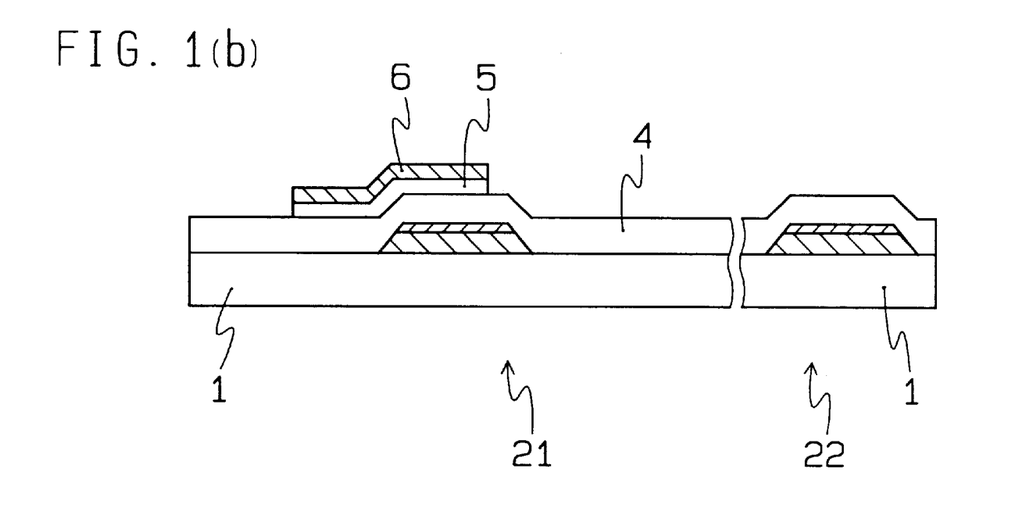

EMBODIMENT 1 will be described below in the producing order. Pure Al or Al alloy (material of the first electrode) is deposited on the transparent insulating substrate 1 by sputtering, followed by the resist patterning by a photo lithography method. Thereafter, the resultant is etched by use of phosphoric acid, nitric acid, or acetic acid etchant, to form the gate wiring (not shown), the gate electrode (the first electrode) and the terminal (See FIG. 1(*a*)). The first layer 2 of the first electrode (the gate electrode) of a lower film and the second layer 3 of the first electrode (the gate electrode) of an upper layer, which are significant features of the present invention, will be discussed below. Then, the gate insulating film 4 made of silicon nitride (SiNx) or silicon oxide ($SiO_2$) is formed in thickness of approximately 4,000 Å by CVD (chemical vapor deposition) or equivalent. Then, the semiconductor layer is deposited on the gate insulating film, followed by patterning the semiconductor layer, to form the semiconductor layer of a-Si film 5 (approximately 1,500 Å thick) and the semiconductor layer of n+a-Si film 6 (approximately 300 Å thick) of low resistance in order (See FIG. 1(*b*)).

Figure 2A:
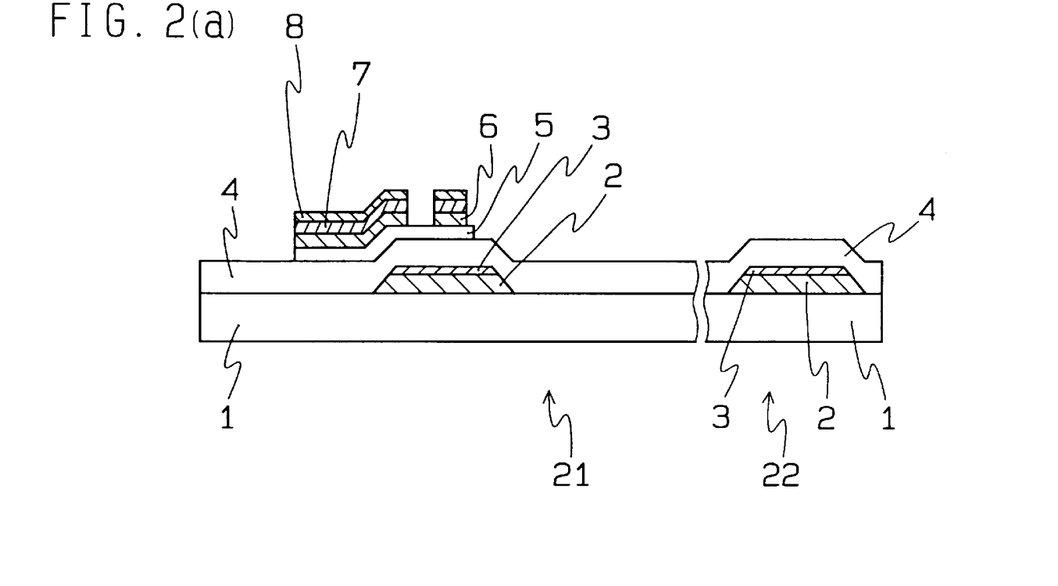
FIGS. 2(a) and 2(b) are each is a sectional view illustrating the structure of the TFT portion and the terminal portion according to EMBODIMENT 1 of the present invention.

Further, the pure Al or the Al alloy, each being material of the first electrode, is deposited again in thickness of approximately 3,000 Å by sputtering, followed by the patterning to form a channel portion and the source/drain electrode portion of transistors. The method of forming the two-layer structure comprising the first layer 7 of the first electrode (the source/drain electrode) of the lower film and the second layer 8 of the first electrode (the source/drain electrode) of the upper film, which is the significant feature of the present invention, will be discussed below (See FIG. 2(*a*)).

Figure 2B:
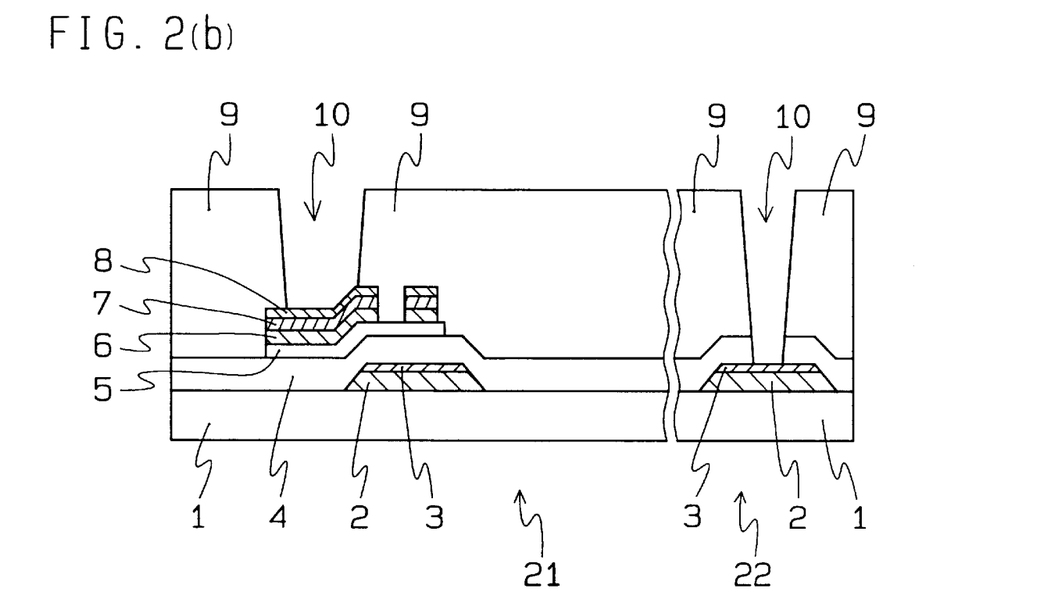
Figure 3:
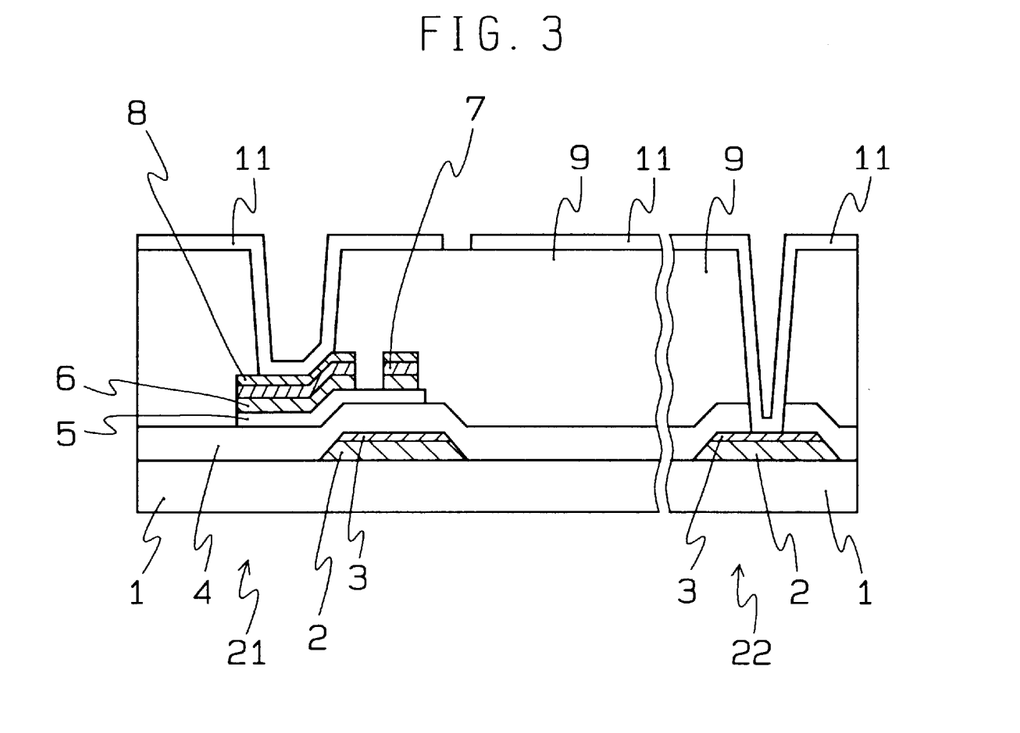
FIG. 3 is a sectional view illustrating the structure of the TFT portion and the terminal portion according to EMBODIMENT 1 of the present invention.

Then, the interlayer insulating film 9 is formed, followed by the patterning to form the contact holes 10. The contact holes are formed in the gate terminal portion and the drain electrode portion of the TFT. It is noted that the interlayer insulating film 9 can be formed of either a silicon nitride film formed by, for example, the CVD or acrylic resin having a transparent property or of combination of the both (See FIG. 2(*b*)).

Finally, the ITO film (Indium tin oxide) is deposited in thickness of approximately 1,000 Å as the transparent conductive film by use of sputtering, followed by the patterning to form the pixel electrodes (the second electrodes) 11, thus obtaining the TFT array substrate. The pixel electrode 11 is electrically connected with the upper films of the gate electrode and the source/drain electrode made of the first electrode material, i.e., with the second layer 3 of the first electrode (the gate electrode) and the second layer 8 of the first electrode (the source/drain electrode), via the contact holes 10 in the interlayer insulating film.

In EMBODIMENT 1, when the gate electrode and the terminal portion were formed by use of pure Al or Al alloy of the first electrode material by sputtering, the first layer 2 of the first electrode was first deposited in thickness of approximately 2,000 Å by use of pure argon(Ar) gas. Sequentially, the second layer 3 of the first electrode was deposited in thickness of approximately 250 Å by use of Ar+$N_2$ mixed gas. The Al film of the second layer thus deposited is formed by reactive sputtering using $N_2$ gas, so that a film to which nitrogen (N) is added is formed. In the case of the source/drain electrode as well, the first layer 7 (approximately 2,000 Å in thickness) of the second electrode of the lower layer made of pure Al or Al alloy and the second layer 8 (approximately 250 Å in thickness) of the second electrode of the upper layer in which nitrogen (N) is added are formed in the same manner.

The film deposition conditions applied to EMBODIMENT 1 are shown in Table 1. The electrical resistance (contact resistivity) at the contact surface between the first electrode made of the pure Al or the Al alloy and the second electrode of the transparent conductive film made of, for example, ITO in the contact hole 10 in the TFT array substrate thus produced showed a good value as low as approximately 350 Ω (minimum value) in per unit area of approximately 50 μm□ at the contact surface.

After the TFT array substrate was annealed at 250° C. for 60 minutes, the contact resistivity of the same showed approximately 750 Ω. Even after the TFT array substrate was further annealed at 300° C. for 60 minutes, the contact resistivity of the same showed approximately 800 Ω. Thus, the contact resistivity in the EMBODIMENT was significantly low, as compared with that in the prior art of 1E10 to 1E12 Ω, and the TFT array substrate was found to have excellent heat resistance.

It should be noted that parameters of the deposit conditions shown in Table 1 should be optimized specifically in individual devices and thus are not restrictive. However, the tendency of the contact resistivity to the parameters was found to be toward a decrease in contact resistivity with increasing deposit pressure of the second layer.

Although the second layer of the first electrode in EMBODIMENT 1 was formed to have a film thickness of 250 Å to obtain a good contact resistivity, the film thickness may be in the range of 50 to 1,000 Å without limiting thereto. This is because, with the film thickness of 50 Å or less, it is difficult to prevent oxygen (O) from diffusing in the interfacial boundary between the ITO and the Al, while, with the film thickness of 1,000 Å or more, the resistance of the entire electrodes increases so much that the merit of decreasing the resistance of the wiring by use of Al can no longer be attained. Further, the film thickness should preferably be in the range of 100 to 500 Å.

TABLE 1

| Deposition condition in the sputtering | | |
|---|---|---|
| | first layer | Second layer |
| deposition pressure (Pa) | 0.27 | 0.2–0.68 |
| flow rate (sccm) | 40 | Ar: 20–80 |
| | | $N_2$: 10–40 |
| deposition power (kW) | 10 | 1–10 |
| deposition temperature (° C.) | 175 | 175 |
| deposition thickness (Å) | 2000–3000 | 100–500 |

In EMBODIMENT 1, when the gate electrode and the terminal portion as well as the source/drain electrode were formed by use of pure Al or Al alloy of the first electrode material by sputtering, two-step sputtering in which the first layer is first deposited by use of pure Ar gas and sequentially the second layer is deposited by use of Ar +$N_2$ mixed gas was adopted, but, instead of two-step sputtering, continuous sputtering in which the pure Ar is used as initial gas and an amount of $N_2$ gas added thereto is allowed to increase gradually can be adopted. This continuous sputtering forms a film having a continuous composition profile in which the amount of nitrogen (N) added increases toward the upper layer of the Al film (the surface contacting with the second electrode).

In addition, the Al alloy having Al as a major component can be used as the Al forming a parent body (first layer) of the first electrode material, in addition to the pure Al. The elements added to the Al alloy should preferably include Cu, silicon(Si), or rare earth element, from the points of suppression of hillock and improvement of corrosion resistance. In order to take advantage of the merit of low electrical resistance of Al, the amount of addition should preferably be limited to the extent that specific resistance does not exceed 10 $\mu\Omega$·cm.

However, the two-layer structure film in which the upper layer portion of the film is capped with a film in which the aluminum nitride (AlNx) is partially formed by Ar+$N_2$ mixed gas sputtering, like that in EMBODIMENT 1, can provide the advantageous effects that the simultaneous etching can be made; that even when pure Al is used, the generation of hillock can be prevented; and that the corrosion resistance can be improved. For this reason, the use of Al alloy having an excellent corrosion resistance is not particularly required for producing the TFT array substrate having a significantly high reliability, which is one of the outstanding significant features of this embodiment.

In the following EMBODIMENT 2 to EMBODIMENT 10, all processes and effects of the invention are the same as those in EMBODIMENT 1, except the way of forming the second layer of the first electrode material of Al to obtain low contact resistivity between the Al film of the first electrode material and the ITO film of the second electrode material. Accordingly, only the description on the way of forming the second layer of the first electrode Al is given below.

Embodiment 2

In the TFT array fabrication process shown in FIGS. 1(a), 1(b), 2(a), 2(b) and 3, the first electrode is formed in the following manner. The second layers, i.e., the second layer 3 of the first electrode and the second layer 8 of the first electrode, to which N was added by injecting nitrogen (N) ion therein via an ion doping or an ion-implantation after the pure Al or Al alloy was deposited in pure Ar gas by sputtering, are formed, followed by the patterning, to form the electrode. The total dose was set at 5E16 to 1E17/cm$^3$.

Even in the case where boron(B) ion and phosphorous(P) ion are used as ionic species, instead of N ion, a similar effect of reducing contact resistivity can be obtained, though not so notable as in the case of N ion.

Embodiment 3

Figure 4:
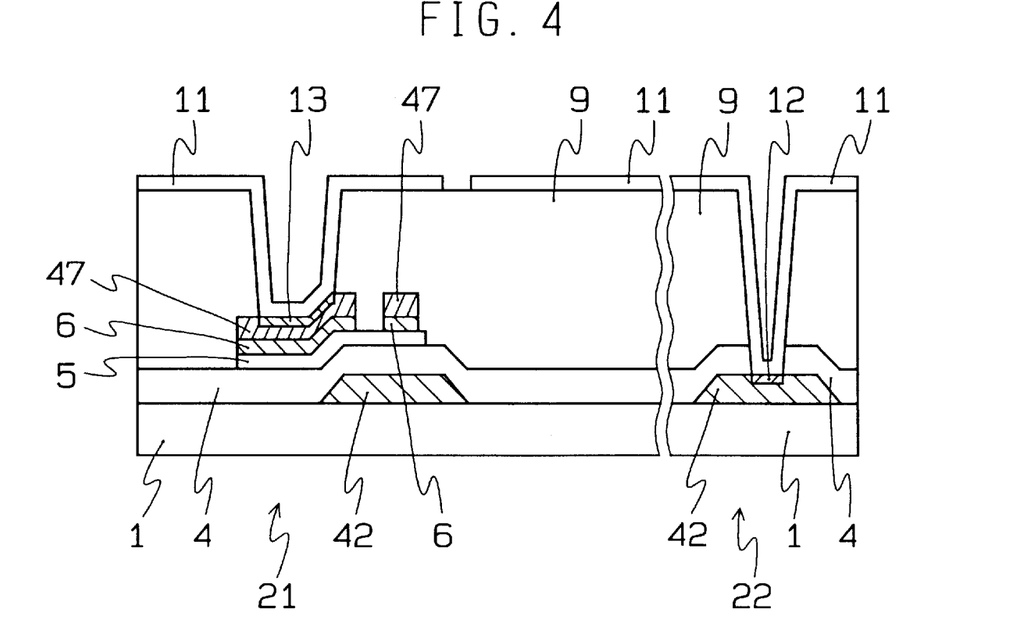
FIG. 4 is a sectional view illustrating the structure of a TFT portion and a terminal portion according to EMBODIMENT 3 of the present invention.

FIG. 4 is a sectional view illustrating the structure of a TFT portion and a terminal portion according to EMBODIMENT 3. In FIG. 4, numeral 12 is the second layer of the contacting portion of the gate electrode; numeral 13 is the second layer of the contacting portion of the source/drain electrode; and numeral 42 and numeral 47 are the first electrodes. Other reference numerals are common to those in FIGS. 1(a) and 1(b). In the TFT array fabrication process of FIGS. 1(a) and 1(b), the first electrodes made of the pure Al or the Al alloy are formed by their deposition in sputtering using the pure Ar gas and then being given the patterning.

After the state of FIG. 1(a) in which the interlayer insulating film 9 is formed and the contact holes 10 are provided therein, N ion is injected by the ion doping, to form the second layers in which the N ion is added to each of the contacting surfaces of the first electrodes. Accordingly, in EMBODIMENT 3 TFT has such a construction that the second layers of the first electrodes (i.e., the second layer 12 of the contacting portion of the gate electrode and the second layer 13 of the contacting portion of the source/drain electrode) are formed only at their contacting portions contacting with the pixel electrode 11 formed of the second electrode ITO film, as shown in FIGS. 2(a) and 2(b).

Embodiment 4

In the TFT fabrication process of EMBODIMENT 2 and EMBODIMENT 3, the second layers of the first electrodes made of pure Al or Al alloy were formed by their being heat-treated (annealed) in an atmosphere of nitride gas, rather than by the ion doping.

The annealing was carried out under the conditions of 300 to 450° C. and 30 to 90 minutes, and $N_2$ gas and $NH_3$ gas were used as the nitride gas. In addition to those, other gases including methylhydrazine, hydrazine and ethylaniline can be used. This modification enables the second layers in which AlNx is formed at low temperature for short annealing time with efficiency.

Embodiment 5

In the TFT fabrication process of EMBODIMENT 2 and EMBODIMENT 3, the second layers of the first electrodes made of pure Al or Al alloy were formed by $N_2$ plasma treatment, rather than by the ion doping. The plasma treatment were carried out under conditions of Power of 500 W in PE mode or RIE mode; 7 to 500 Pa in $N_2$ gas pressure; and 15 to 60 seconds in treatment time. It should be noted that parameters of the film deposition conditions should also be optimized specifically in individual treatment devices and thus are not restrictive.

Embodiment 6

In the TFT fabrication process of EMBODIMENT 2 and EMBODIMENT 3, the second layers of the first electrodes made of pure Al or Al alloy are formed by the TFT array substrate being immersed in aqueous ammonia $NH_4OH$ to allow the first electrodes to be dipped in $NH_4OH$. In addition, after being immersed in $NH_4OH$, the first electrodes can be annealed in an atmosphere of nitride gas, as in EMBODIMENT 4.

Embodiment 7

In the TFT fabrication process of EMBODIMENT 1, the first electrode made of pure Al or Al alloy were first deposited by sputtering using pure Ar gas and then the second layers were deposited by reactive sputtering using Ar+$NH_3$ mixed gas, followed by the patterning, to form the electrode.

In addition to the mixed gas above, in the case of Ar+$O_2$, Ar+$N_2$+$CO_2$ and Ar+$N_2$+$CF_4$ being used as the mixed gas for depositing the second layers or even in the case of $SiH_4$ being further added thereto, the effect of reducing contact resistivity was able to be obtained. Therefore, even when N, O or N+C+O+Si is added to Al of the second layers as impurities, the specific effect of the present invention can be fully provided.

Embodiment 8

In the TFT fabrication process of EMBODIMENT 1, on the first electrodes (the gate electrode and the source/drain electrode), made of pure Al or Al alloy, formed by sputtering using pure Ar gas are deposited silicon nitride films as the gate insulating film and the interlayer insulating film formed on each of the first electrodes by using plasma CVD method using the mixed gas of $SiH_4+H_2+NH_3+N_2$, followed by the addition of the Si and N thereto using interfacial diffusion, to thereby form the second layers of the first electrodes.

Embodiment 9

Figure 5:
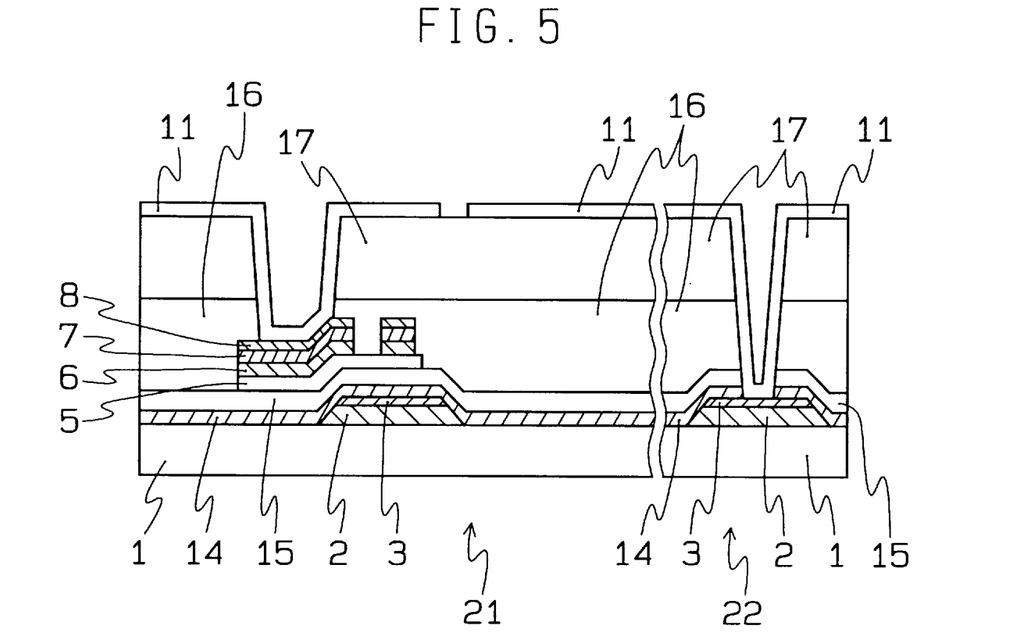
FIG. 5 is a sectional view illustrating the structure of a TFT according to EMBODIMENT 9 of the present invention.

FIG. 5 is a sectional view illustrating the structure of a TFT portion and a terminal portion according to EMBODIMENT 9 of the invention. Numeral 14 is the first layer of the gate insulating film; numeral 15 is the second layer of the gate insulating film; numeral 16 is the first layer of the interlayer insulating film; and numeral 17 is the second layer of the interlayer insulating film. Other reference numerals are common to those in FIGS. 1 to 4.

At least two layers of the silicon nitride films are formed on the first electrodes made of pure Al or Al alloy in EMBODIMENT 8, as shown in FIG. 5. The initial film deposition, in particular, is performed by plasma CVD method using mixed gas of $CF_4$ being further added to mixed gas of $SiH_4+H_2+NH_3+N_2$. By the mixture of $CF_4$ gas, the first layer 14 of the gate insulating film and the second layer 16 of the gate insulating film can be formed as the silicon nitride film rich in N and chemically unstable. Accordingly, Si and N are diffused so easily that the second layers of the first electrodes to which Si and N are added with efficiency can be formed.

Embodiment 10

In the TFT array fabrication process of EMBODIMENT 8, the gate insulating film and the interlayer insulating film are made of silicon oxide $SiO_2$, and Si and O elements are added thereto by the interfacial diffusion, to form the second layers of the first electrodes. This can also produce a similar effect of reducing the contact resistance.

Embodiment 11

Figure 6:
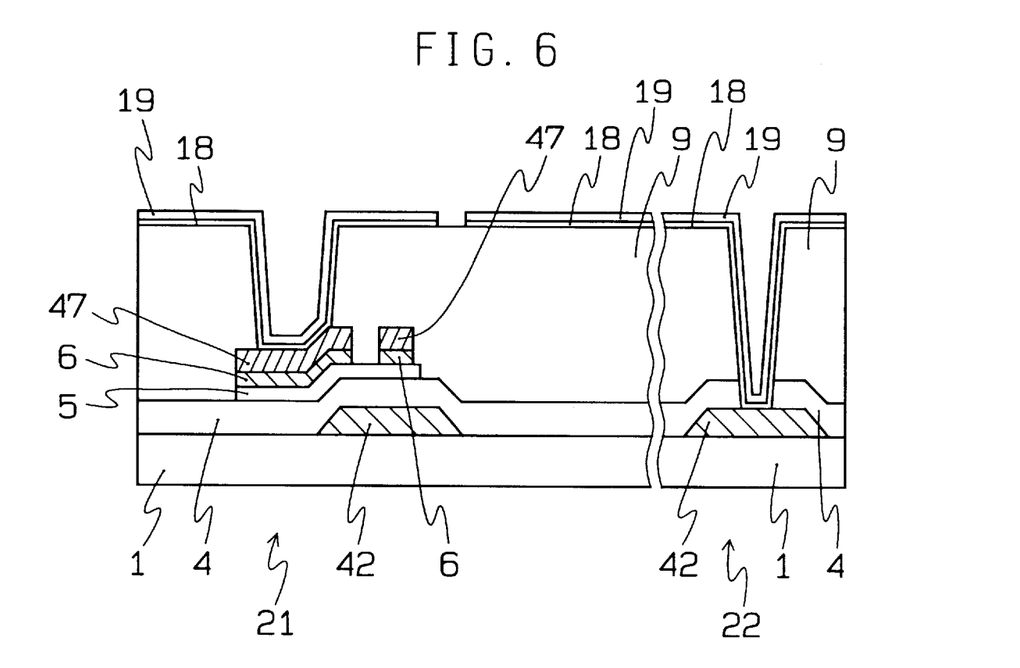
FIG. 6 is a sectional view illustrating the structure of a TFT according to EMBODIMENT 11 of the present invention.

FIG. 6 is a sectional view illustrating the structure of a TFT portion and a terminal portion according to EMBODIMENT 11 of the present invention. Numeral 18 is the first layer of the pixel electrode made of ITO; and numeral 19 is the second layer of the pixel electrode made of ITO. Other reference numerals are common to those in FIGS. 1 to 5. In the TFT array fabrication process of EMBODIMENT 11 shown in FIG. 1, the pixel electrode 11 of the second electrode formed of a transparent conductive oxide film like the ITO film of FIG. 3 was so formed as to have a two-layer structure. The second layer 18 of the pixel electrode was deposited in thickness of approximately 500 Å by sputtering using only the pure Ar gas, and thereafter the first layer 19 of the pixel electrode was deposited thereon in thickness of approximately 500 Å by a known method using $Ar+O_2$ gas.

Thus, by reducing the amount of O in the initial ITO film contacting with the first electrodes made of pure Al or Al alloy, the formation of AixOy at the interfacial boundaries of the first electrodes caused by the diffusion of the O can be prevented to realize the low contact resistivity of the order of some hundreds to some kilos of ohms.

Preferably, the film thickness of the second layers of the second electrodes made of ITO and the like should be of the order of 100 to 500 Å. This is because, with the film thickness of less than 100 Å, the effect of reducing the contact resistivity cannot be fully achieved, while on the other hand, with the ITO film having fewer O, the specific resistance is high and also the transmittance is low, so the light transmittance of the TFT array is reduced to deteriorate its characteristics.

It is to be noted that in the above EMBODIMENT 1 to EMBODIMENT 11, reference was made to the case that pure Al or Al alloy is used as the first electrode material and ITO film is used as the second electrode material, but the effects of the invention can be provided without limiting to those electrode materials. For example, even in the case where tantalum(Ta) is used as the first electrode and other transparent oxidation conductive film using any of idium oxide($In_2O_3$), tin oxide($SnO_2$), zinc oxide(ZnO), etc. as a base is used as the second electrode material, similar effects can be provided.

Embodiment 12

The TFT array substrate formed by any of the above-described producing methods in EMBODIMENT 1 through EMBODIMENT 11 was used and was bonded together with the opposite substrate having the opposite electrode, color filters and others. Further, the liquid crystal material was injected in between the substrates to be interposed therebetween, to obtain the TFT active matrix type liquid crystal display (TFT-LCD device). According to EMBODIMENT 12, Al of a low resistance wiring is used for the wiring and the electrodes in the TFT array substrate and is brought into direct contact with the pixel electrode formed of the ITO transparent film without forming another metal layer having any other metals than Al as a major component. This could provide an excellent liquid crystal display having a high aperture ratio and high performance and being able to be fabricated with improved productivity and reduced costs, as compared with the conventional devices.

A method for producing a thin film transistor of the invention according to the present invention comprises the steps of:

(i) forming a first electrode, comprising at least one of a gate, a source and a drain, on a transparent insulating substrate by using either of pure Al and Al alloy;

(ii) adding an impurity comprising at least one of N, O, Si and C to an upper layer of the first electrode, to form a second layer to which the impurity is added and a first layer to which the impurity is not added;

(iii) depositing an insulating film on the first electrode and the substrate, said insulating film covering the first electrode and the substrate;

(iv) subjecting the insulating film to a patterning to form a contact hole; and (v) forming a second electrode comprising a transparent film electrode on the insulating film, to electrically connect the second electrode with the first electrode through the contact hole, thus, producing the effect of easily producing a thin film transistor which enables a low contact resistivity by direct association with ITO and the like.

The thin film transistor of the invention according to the present invention comprises: a first electrode comprising a gate, a source and a drain formed on a transparent insulating substrate; an insulating film then formed on the first electrode and the transparent insulating substrate, said insulating film covering said first electrode and said transparent insulating substrate; and a second electrode formed on the insulating film, the first electrode comprising a first layer of a lower layer made of either of pure Al and Al alloy and a second layer formed by an impurity comprising at least one of N, O, Si and C being added to the either of the pure Al and the Al alloy, the second electrode comprising a transparent film electrode, to electrically connect the second electrode with the second layer of the first electrode. This can produce the effect of easily producing a thin film transistor which enables a low contact resistivity by direct association with ITO and the like.

In the thin film transistor of the invention according to the present invention, an impurity composition profile is in the form of being continuously distributed in an interfacial boundary between the first layer and the second layer, thus producing the effect of easily producing a thin film transistor which enables a low contact resistivity by direct association with ITO and the like.

In the thin film transistor of the invention according to the present invention, the first layer and the second layer are formed of layers able to be etched simultaneously, thus producing the effect of easily producing a thin film transistor which enables a low contact resistivity by direct association with ITO and the like. Only the material of Al is used, so only one etching is simply required in the patterning, thus producing the effect of simplifying the film deposition (reduction of kinds of wiring materials) and the etching process.

In the thin film transistor of the invention according to the present invention, the transparent film electrode is made of any of indium oxide, tin oxide, indium tin oxide and zinc oxide, thus producing the effect of easily producing a thin film transistor which enables a low contact resistivity by direct association with ITO and the like.

A liquid crystal display of the invention according to the present invention comprises a TFT array substrate including at least a thin film transistor comprising a first electrode comprising a gate, a source and a drain formed on a transparent insulating substrate; an insulating film formed on the first electrode and the transparent insulating substrate, the insulating film covering the first electrode and the transparent insulating substrate; and a second electrode formed on the insulating film, the first electrode comprising a first layer of a lower layer made of either of pure Al and Al alloy and a second layer formed by an impurity comprising at least one of N, O, Si and C being added to the either of the pure Al and the Al alloy, the second electrode comprising a transparent film electrode, to electrically connect the second electrode with the second layer of the first electrode. This can produce the effect that an excellent liquid crystal display having a high aperture ratio and high display performance characteristics and being able to be fabricated with improved productivity and reduced costs, as compared with the conventional type devices, is produced by use of the thin film transistor which enables a low contact resistivity by direct association with ITO and the like.

The second layer is formed by sputtering using an $Ar+N_2$ mixed gas, thus providing the effect of obtaining a thin film transistor which enables a low ITO/Al contact resistivity. Further, the electrodes of the invention having the two-layer structure can be formed in the same process by the same sputtering system by simply changing the kinds of gases, thus producing the effect of providing simplified process and improved productivity.

The second layer is formed by sputtering using either of an $Ar+N_2+CO_2$ mixed gas and $Ar+N_2+CF_4$ mixed gas, thus providing the effect of obtaining a thin film transistor which enables a low ITO/Al contact resistivity. Further, the electrodes of the invention having the two-layer structure can be formed in the same process by the same sputtering system by simply changing the kinds of gases, thus producing the effect of providing simplified process and improved productivity.

The second layer is formed by the process that after deposition of the first layer made of at least either of pure Al and Al alloy, $N_2$ ions are filled therein, thus providing the effect of obtaining a thin film transistor which enables a low ITO/Al contact resistivity.

The second layer is formed on only a surface of a contacting portion by the filling of $N_2$ ions after the aforementioned process (iv), thus providing the effect of obtaining a thin film transistor which enables a low ITO/Al contact resistivity.

The second layer is formed by the process that the first layer is formed, followed by the annealing in an atmosphere of nitride gas, thus providing the effect of obtaining a thin film transistor which enables a low ITO/Al contact resistivity.

The second layer is formed on only the surface of the contacting portion by the annealing in an atmosphere of nitride gas after the aforementioned process (iv), thus providing the effect of obtaining a thin film transistor which enables a low ITO/Al contact resistivity.

The second layer is formed by $N_2$ plasma treatment after the deposition of the first layer, thus providing the effect of obtaining a thin film transistor which enables a low ITO/Al contact resistivity.

The second layer is formed on only the surface of the contacting portion by $N_2$ plasma treatment after the aforementioned process (iv), thus providing the effect of obtaining a thin film transistor which enables a low ITO/Al contact resistivity.

The addition of an impurity to the second layer is made by using any of gas including O as a substitute for N, gas including Si, and gas including C, thus providing the effect of obtaining a thin film transistor which enables a low ITO/Al contact resistivity.

The second layer is formed by sputtering either of $Ar+NH_3$ mixed gas, thus providing the effect of obtaining a thin film transistor which enables a low ITO/Al contact resistivity.

Further, the electrodes of the invention having the two-layer structure can be formed in the same process by the same sputtering system by simply changing the kinds of gases, thus producing the effect of providing simplified process and improved productivity.

The second layer is formed by the process that after the formation of the first layer, the transparent insulating substrate on which the first layer is formed is immersed in $NH_4OH$ and then is annealed, thus providing the effect of obtaining a thin film transistor which enables a low ITO/Al contact resistivity. Further, the electrodes of the invention having the two-layer structure can be formed in the same process by the same sputtering system by simply changing the kinds of gases, thus producing the effect of providing simplified process and improved productivity.

In the insulating film deposition process of the process (iii) of the present invention, the insulating film is formed of a silicon nitride film, and the second layer which is allowed to have Si and N as impurities by diffusion is formed on the surface of the first electrode made of either of the pure Al and the Al alloy. This provides the effect of obtaining a thin film transistor which enables a low ITO/Al contact resistivity.

The second layer is formed by allowing the silicon nitride film of the insulating film to grow by CVD method using mixed gas of $SiH_4$, $H_2$, $NH_3$ and $N_2$, to allow Si and N to diffuse on the surface of the first layer, thus providing the effect of obtaining a thin film transistor which enables a low ITO/Al contact resistivity.

The silicon nitride film of the insulating film is formed to have at least a two-layer structure, and the initial layer of silicon nitride film, in particular, is formed by CVD method using mixed gas of $SiH_4$, $H_2$, $NH_3$ and $N_2+CF_4$, thus providing the effect of obtaining a thin film transistor which enables a low ITO/Al contact resistivity.

In the insulating film deposition process of the process (iii) of the present invention, the insulating film is formed of $SiO_2$, and the second layer which is allowed to have Si and O as impurities by diffusion is formed on the surface of the first electrode made of either of the pure Al and the Al alloy, thus providing the effect of obtaining a thin film transistor which enables a low ITO/Al contact resistivity.

In the process for forming the second electrode formed of the transparent electrode in the process (v) of the present invention, the second electrode comprises the first layer formed by sputtering using at least the Ar gas only and the second layer formed by sputtering using the mixed gas of $Ar+O_2$ and also the first layer of the second electrode and the second layer of the first electrode are electrically connected. This provides the effect of obtaining a thin film transistor which enables a low ITO/Al contact resistivity.

Though several EMBODIMENTS of the present invention are described above, it is to be understood that the present invention is not limited only to the above-mentioned, various changes and modifications may be made in the invention without departing from the spirit and scope thereof.

What is claimed is:

1. Thin film transistor device comprising:
   a first electrode, comprising at least one of a gate, a source and a drain, formed on a transparent insulating substrate;
   an insulating film formed on said first electrode and said transparent insulating substrate, said insulating film covering said first electrode and said transparent insulating substrate; and
   a second electrode formed on said insulating film, wherein said first electrode comprises a first layer of a lower layer made of one of pure Al and Al alloy and a second layer formed by an impurity which comprises at least one of N, O, Si and C being added to said one of said pure Al and said Al alloy,
   wherein said second electrode comprises a transparent film electrode, and said second layer is provided at an interconnection between said second electrode, and said first layer of said first electrode.

2. The thin film transistor of claim 1, wherein an impurity composition profile is in a form of being continuously distributed in an interfacial boundary between said first layer and said second layer.

3. The thin film transistor of claim 1, said first layer and said second layer are formed of layers able to be etched simultaneously.

4. The thin film transistor of claim 1, wherein said transparent film electrode is made of any of indium oxide, tin oxide, indium tin oxide and zinc oxide.

5. A liquid crystal display comprising:
   a TFT array substrate including at least a thin film transistor device comprising a first electrode comprising at least one of a gate, a source and a drain formed on a transparent insulating substrate;
   an insulating film formed on said first electrode and said transparent insulating substrate, said insulating film covering said first electrode and said transparent insulating substrate; and
   a second electrode formed on said insulating film, wherein said first electrode comprises a first layer of a lower layer made of one of pure Al and Al alloy and a second layer formed by an impurity which comprises at least one of N, O, Si and C being added to said one of said pure Al and said Al alloy, said second electrode comprising a transparent film electrode, and said second layer is provided at an interconnection between said second electrode and said first layer of said first electrode.

6. The thin film transistor device of claim, 1, wherein said second layer has a thickness of 50–1000 Å.

7. The thin film transistor device of claim 1, wherein said second layer has a thickness of 100–500 Å.

8. The thin film transistor device of claims 1, 4, 6 or 7, wherein said first layer, said second layer and said insulating film are formed by at least one of sputtering, reactive sputtering, two-step sputtering, continuous sputtering, plasma CVD, interfacial diffusion, ion-implantation and ion doping.

9. The liquid crystal display of claim 5, wherein said second layer has a thickness of 50–1000 Å.

10. The liquid crystal display of claim 5, wherein said second layer has a thickness of 100–500 Å.

11. The liquid crystal display of claims 5, 9 or 10, wherein said first layer, said second layer and said insulating film are formed by at least one of sputtering, reactive sputtering, two-step sputtering, continuous sputtering, plasma CVD, interfacial diffusion, ion doping and ion-implantation.

12. The liquid crystal display of claims 5, 9 or 10, wherein said second electrode is made of any of indium oxide, tin oxide, indium tin oxide and zinc oxide.

13. The thin film transistor device of claims 1, 4, 6 or 7, wherein said first layer is formed by sputtering and said second layer is formed by at least one of ion doping and ion-implantation followed by patterning to form said first electrode.

14. The thin film transistor device of claim 1, 4, 6 or 7, wherein said second layer is formed only at the contacting portions of said first electrode and said second electrode.

15. The thin film transistor device of claim 14, wherein said first layer is formed by sputtering and said second layer is formed by ion doping.

16. The thin film transistor device of claim 1, 4, 6 or 7, wherein said first layer is formed by sputtering and said second layer is formed by annealing said first layer in an atmosphere of nitride gas.

17. The thin film transistor device of claim 14, wherein said first layer is formed by sputtering and said second layer is formed by annealing said first layer in an atmosphere of nitride gas.

18. The thin film transistor device of claim 1, 4, 6 or 7, wherein said first layer is formed by sputtering and said second layer is formed by $N_2$ plasma treatment.

19. The thin film transistor device of claim 14, wherein said first layer is formed by sputtering and said second layer is formed by $N_2$ plasma treatment.

20. The thin film transistor device of claim 1, 4, 6 or 7, wherein said first layer is formed by sputtering and said second layer is formed by immersing said first layer and said transparent insulating substrate in aqueous ammonia and annealing said first layer in an atmosphere of nitride gas.

21. The thin film transistor device of claim 14, wherein said first layer is formed by sputtering and said second layer is formed by immersing said first electrode and said transparent insulating substrate in aqueous ammonia and annealing said first layer in an atmosphere of nitride gas.

22. The thin film transistor device of claim 1, 4, 6 or 7, wherein said first layer is formed by sputtering and said second layer is formed by reactive sputtering with a mixture of Ar and at least one of $NH_3$, $O_2$, $N_2$, $CO_2$, $CF_4$ and $SiH_4$ gases followed by patterning of said first electrode.

23. The thin film transistor device of claim 14, wherein said first layer is formed by sputtering and said second layer is formed by reactive sputtering with a mixture of Ar and at least one of $NH_3$, $O_2$, $N_2$, $CO_2$, $CF_4$ and $SiH_4$ gases followed by patterning of said first electrode.

24. The thin film transistor device of claims 1, 4, 6 or 7, wherein:

said first layer is formed by sputtering;

said insulating film is formed by plasma CVD with a mixture of $SiH_4$, $H_2$, $NH_3$ and $N_2$ gases; and said second layer is formed by interfacial diffusion of Si and N from said insulating film.

25. The thin film transistor device of claims 1, 4, 6 or 7, wherein:

said first layer is formed by sputtering;

said insulating film is formed by plasma CVD with a mixture of $SiH_4$, $H_2$, $NH_3$, $N_2$ and $CF_4$ gases; and said second layer is formed by interfacial diffusion of Si and N from said insulating film.

26. The thin film transistor device of claims 1, 4, 6 or 7, wherein:

said first layer is formed by sputtering;

said insulating film is formed by plasma CVD with $SiO_2$ gas; and said second layer is formed by interfacial diffusion of Si and O from said insulating film.

27. The liquid crystal display of claims 5, 9 or 10, wherein said first layer is formed by sputtering and said second layer is formed by at least one of ion doping and ion-implantation followed by patterning to form said first electrode.

28. The liquid crystal display of claims 5, 9 or 10, wherein said second layer is formed only at the contacting portions of said first electrode and said second electrode.

29. The liquid crystal display of claims 5, 9 or 10, wherein said first layer is formed by sputtering and said second layer is formed by annealing said first layer in an atmosphere of nitride gas.

30. The liquid crystal display of claim 28, wherein said first layer is formed by sputtering and said second layer is formed by annealing said first layer in an atmosphere of nitride gas.

31. The liquid crystal display of claims 5, 9 or 10, wherein said first layer is formed by sputtering and said second layer is formed by $N_2$ plasma treatment.

32. The liquid crystal display of claim 28, wherein said first layer is formed by sputtering and said second layer is formed by $N_2$ plasma treatment.

33. The liquid crystal display of claims 5, 9 or 10, wherein said first layer is formed by sputtering and said second layer is formed by immersing said first layer and said transparent insulating substrate in aqueous ammonia and annealing said first layer in an atmosphere of nitride gas.

34. The liquid crystal display of claim 28, wherein said first layer is formed by sputtering and said second layer is formed by immersing said first layer and said transparent insulating substrate in aqueous ammonia and annealing said first layer in an atmosphere of nitride gas.

35. The liquid crystal display of claims 5, 9 or 10, wherein said first layer is formed by sputtering and said second layer is formed by reactive sputtering with a mixture of Ar and at least one of $NH_3$, $O_2$, $N_2$, $CO_2$, $CF_4$ and $SiH_4$ gases followed by patterning to form said first electrode.

36. The liquid crystal display of claim 28, wherein said first layer is formed by sputtering and said second layer is formed by reactive sputtering with a mixture of Ar and at least one of $NH_3$, $O_2$, $N_2$, $CO_2$, $CF_4$ and $SiH_4$ gases followed by patterning said first electrode.

37. The liquid crystal display of claims 5, 9 or 10, wherein:

said first layer is formed by sputtering;

said insulating film is formed by plasma CVD with a mixture of $SiH_4$, $H_2$, $NH_3$ and $N_2$ gases; and said second layer is formed by interfacial diffusion of Si and N from said insulating film.

38. The liquid crystal display of claims 5, 9 or 10, wherein:

said first layer is formed by sputtering;

said insulating film is formed by plasma CVD with a mixture of $SiH_4$, $H_2$, $NH_3$, $N_2$ and $CF_4$ gases; and said second layer is formed by interfacial diffusion of Si and N from said insulating film.

39. The liquid crystal display of claims 5, 9 or 10, wherein:

said first layer is formed by sputtering;

said insulating film is formed by plasma CVD with $SiO_2$ gas; and said second layer is formed by interfacial diffusion of Si and O from said insulating film.

40. Thin film transistor device comprising:

a first electrode, comprising at least one of a gate, a source and a drain, formed on a transparent insulating substrate, wherein said first electrode comprises one of pure Al and Al alloy;

an insulating film formed on said first electrode and said transparent insulating substrate, said insulating film covering said first electrode and said transparent insulating substrate; and a second electrode, formed on said insulating film, wherein said second electrode comprises a first layer made of a transparent conductive oxide and a second layer, said second layer has an oxygen content lower than that of said first layer, and said second layer is provided at an interconnection between said first electrode and said first layer of said second electrode.

41. The thin film transistor device of claim 40, wherein said first layer has a thickness of 100–500 Å.

42. A liquid crystal display comprising:

a TFT array substrate including at least a thin film transistor device comprising a first electrode comprising at least one of a gate, a source and a drain formed on a transparent insulating substrate, wherein said first electrode comprises one of pure Al and Al alloy;

an insulating film formed on said first electrode and said transparent insulating substrate, said insulating film covering said first electrode and said transparent insulating substrate; and a second electrode, formed on said insulating film, wherein said second electrode comprises a first layer made of a transparent conductive oxide and a second layer, said second layer has an oxygen content lower than that of said first layer, and said second layer is provided at an interconnection between said first electrode and said first layer of said second electrode.

43. The thin film transistor device of claim 42, wherein said first layer has a thickness of 100–500 Å.

44. Thin film transistor device comprising:

a first electrode, comprising at least one of a gate, a source and a drain, formed on a transparent insulating substrate;

an insulating film formed on said first electrode and said transparent insulating substrate, said insulating film covering said first electrode and said transparent insulating substrate; and a second electrode comprising a transparent film electrode formed on said insulating film, wherein said first electrode comprises a layer made of one of pure Al and Al alloy, and means for connecting said layer to said second electrode.

45. A liquid crystal display comprising:

a TFT array substrate including at least a thin film transistor device comprising a first electrode comprising at least one of a gate, a source and a drain formed on a transparent insulating substrate;

an insulating film formed on said first electrode and said transparent insulating substrate, said insulating film covering said first electrode and said transparent insulating substrate; and a second electrode comprising a transparent film electrode formed on said insulating film, wherein said first electrode comprises a layer made of one of pure Al and Al alloy, and means for connecting said layer to said second electrode.

46. Thin film transistor device comprising:

a first electrode, comprising at least one of a gate, a source and a drain, formed on a transparent insulating substrate, wherein said first electrode comprises one of pure Al and Al alloy;

an insulating film formed on said first electrode and said transparent insulating substrate, said insulating film covering said first electrode and said transparent insulating substrate; and a transparent film electrode formed on said insulating film, comprising a layer made of a transparent conductive oxide and means for connecting said layer to said first electrode.

47. A liquid crystal display comprising:

a TFT array substrate including at least a thin film transistor device comprising a first electrode comprising at least one of a gate, a source and a drain formed on a transparent insulating substrate, wherein said first electrode comprises one of pure Al and Al alloy;

an insulating film formed on said first electrode and said transparent insulating substrate, said insulating film covering said first electrode and said transparent insulating substrate; and a transparent film electrode formed on said insulating film, comprising a layer made of a transparent conductive oxide and means for connecting said layer to said first electrode.

* * * * *

UNITED STATES PATENT AND TRADEMARK OFFICE
CERTIFICATE OF CORRECTION

PATENT NO. : 6,252,247 B1  Page 1 of 1
DATED : June 26, 2001
INVENTOR(S) : Sakata et al.

It is certified that error appears in the above-identified patent and that said Letters Patent is hereby corrected as shown below:

<u>Title page, Item [54], and Column 1, line 1,</u>
The Title should be:

-- [54] A THIN FILM TRANSISTOR DEVICE, A LIQUID CRYSTAL DISPLAY USING A TFT ARRAY SUBSTRATE --

Signed and Sealed this

Nineteenth Day of February, 2002

*Attest:*

*Attesting Officer*

JAMES E. ROGAN
*Director of the United States Patent and Trademark Office*